United States Patent Office 3,462,690

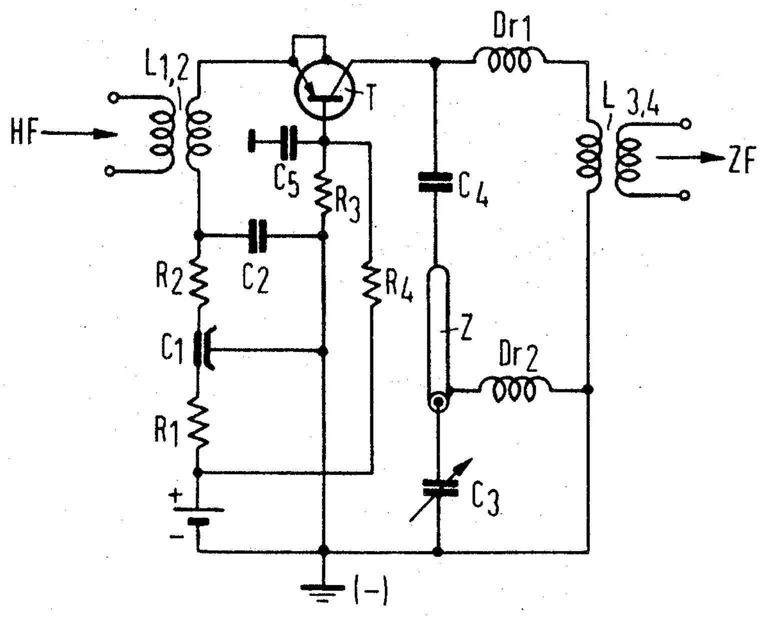
L1,2
HF
T
C5
R3
C4
Dr1
L 3,4
ZF
R2
C2
R4
C1
Z
Dr2
R1
C3
+
-
(-)

Patented Aug. 19, 1969

3,462,690

SELF-OSCILLATING TRANSISTOR MIXER HAVING TWO RC MEMBERS IN EMITTER CIRCUIT

Horst Pelka, Munich, Germany, assignor to Siemens Aktiengesellschaft, a corporation of Germany Filed Sept. 21, 1964, Ser. No. 397,913
Claims priority, application Germany, Sept. 24, 1963, S 87,486
Int. Cl. H04b 1/26
U.S. Cl. 325—440 4 Claims

ABSTRACT OF THE DISCLOSURE

A capacitor arrangement provides a high frequency bypass across a resistor arrangement which is series connected in the emitter circuit of a transistor which has a high frequency input emitter circuit and an oscillatory collector circuit. The resistor and capacitor arrangements are subdivided and jointly form two component RC members having respectively different time constants.

My invention relates to self-oscillating transistor mixers, particularly for ultra-high frequencies.

Among the requirements to be met by such mixers are the following:

In the first place, the input of the mixer circuit is supposed to constitute a good bypass for the intermediate frequency being generated in the mixer;

Secondly, the resistance in the emitter circuit of the transistor should be as large as feasible, in order to provide for good thermal stability and to render the performance largely independent of inevitable differences between specimens of the same type;

Thirdly, the time constant of the RC member, constituted by the emitter resistor and the emitter-to-ground capacitor, should be made as small as possible in order to prevent pendulous oscillations.

These three requirements cannot be satisfied simultaneously because the first two together are contrary to the third.

It is thus necessary to either satisfy certain requirements as well as feasible at the expense of the other requirements, or to aim at a compromise by approaching all three requirements within certain tolerances.

It is an object of my invention to solve the above-mentioned problem toward achieving a good compromise as regards all of the three essential requirements to a better extent than heretofore attained, and with the aid of relatively simple and reliable circuit components.

According to my invention, a self-oscillating mixer circuit, preferably for use in the ultra-high-frequency range, has its transistor equipped with an emitter circuit in which the emitter series resistance and the capacitance which constitutes a bypass for high-frequency across this resistance, are split into two component RC members having different respective time constants, both of which are active in the emitter circuit.

According to another feature of the invention, one of the two RC members, namely the one having the longer time constant, is constituted by the lead-in capacitor by means of which a bias voltage is applied to the emitter through the transistor housing or encapsulation, together with a first resistor series-connected in the emitter circuit; whereas the second RC member having the shorter time constant is formed by a second resistor connected in series with the first resistor, and by a capacitor connected between ground and a circuit point located in the emitter circuit at the second resistor.

The above-mentioned and further features of my invention, said features being set forth with particularity in the claims annexed hereto, will be further described and explained with reference to an embodiment of a self-oscillating transistor mixer according to the invention illustrated by way of example in the accompanying drawing in which the single figure is a schematic circuit diagram of the mixer of the present invention.

The illustrated mixer circuit may form a stage of a high-frequency or video amplifier. The mixer receives high-frequency input HF through an inductive coupling $L_{1,2}$ and mixes the input frequency with the self-oscillation frequency to which the mixer stage is tuned, to issue an intermediate frequency ZF through another coupling inductane $L_{3,4}$.

The mixer stage comprises a transistor T whose collector is connected through a capacitor C4, with the inner wire of a coaxial conductor piece Z, the other end of the inner wire being connected through a variable capacitor C3 to ground. The conductor portion Z constitutes a resonant circuit which determines the oscillator frequency of the mixer stage. Aside from the inductive coupling $L_{1,2}$, the input circuit connected to the emitter contains a series connection of two RC members R1, C1 and R2, C2. The source of a slight emitter bias voltage (normally a few volts) is shown connected between resistor R1 and ground.

The base-current supply portion of the mixer circuit may be given any conventional configuration and is not essential to the invention. For example, however, the illustrated embodiment shows the following connections. The bias potential is applied to the base of the transistor through a voltage divider composed of resistors R3 and R4 which are high-frequency bypassed by a capacitor C5. The conductor portion Z is further shown grounded through a choke coil $Dr_2$. Another choke coil $Dr_1$ is connected between the collector of transistor T and the coupling inductance $L_{3,4}$.

As mentioned above, the high-frequency input indicated by the arrow HF, is applied to the inductive coupling $L_{1,2}$, and the generated intermediate frequency indicated by an arrow ZF, issues from transistor T through the choke $Dr_1$ and the inductive coupling $L_{3,4}$ to the intermediate-frequency stages (not shown) of the amplifier.

The capacitor C1 is formed by a leading-in or leading-through capacitor and hence is constituted by a leading-in structure through which the direct-voltage bias supply for the emitter of transistor T passes through the encapsulation or housing of the transistor. The leading-in wire passing into the encapsulation has relative thereto a large capacitance so that any high-frequency arriving on the direct-voltage lead can directly pass through the lead-in capacitance to the encapsulation and thus to ground.

The following examples of parameter values, relating to the circuit diagram according to the accompanying drawing, are applicable for a receiving frequency range of 470 to 860 mc.:

| | | |
|---|---|---|
| $R_1$ | kilohms | 1.2 |
| $R_2$ | ohms | 300 |
| $R_3$ | kilohms | 12 |
| $R_4$ | do | 3.9 |
| $C_1$ | nf | 5–10 |
| $C_2$ | pf | 200–300 |
| $C_4$ | pf | 5 |
| $C_5$ | nf | 1 |
| $Dr_1$ | µh | 0.3 |
| $Dr_2$ | µh | 0.2 |

For the above-mentioned range of receiving frequencies, these parameter values result in an intermediate frequency of 40 mc. It will be understood that the numerical values given are presented only as an example and may be modified, especially if other input frequencies or a different intermediate frequency is desired.

Due to the subdivision of the RC member in the emitter circuit of a mixer according to the invention, two different time constants are active in the circuit. This has the following results.

The above-mentioned first requirement according to which the input of the mixer circuit is to constitute a good bypass for the intermediate frequency, is satisfied by the capacitor $C_2$ in conjunction with the inductance $L_{1,2}$. The second requirement, aiming at good temperature stabilization and avoidance of specimen differences or fluctuations, is satisfied by the provision of the resistors R1 and R2. The third requirement, demanding a short time constant of the member constituted by the emitter resistance and the emitter grounding capacitance, is satisfied by the component RC member R2, C2. The fact that the short time constant of this RC member occurs together with the longer time constant of the series-connected RC member formed by capacitor C1 and resistor R1, is not detrimental to the effect of the short time constant. That is, the long time constant results in a coarse adjustment of the working point, whereas the fine adjustment is effected by the member having the shorter time constant.

I claim:

1. A self-oscillating transistor mixer, comprising a transistor having a high-frequency input emitter circuit and having an oscillatory collector circuit, coupling means connected with said collector circuit for issuing an intermediate frequency output, resistance means series-connected in said emitter circuit, capacitance means forming a high-frequency bypass across said resistance means, said resistance means and said capacitance means being subdivided and jointly forming two component RC members having respectively different time constants.

2. A self-oscillating transistor mixer, comprising a transistor having a high-frequency input emitter circuit and having an oscillatory collector circuit, coupling means connected with said collector circuit for issuing an intermediate frequency output, emitter bias supply means comprising a capacitively grounded lead-in conductor at said transistor, resistance means series-connected with said lead-in conductor in said emitter circuit, capacitance means comprising the grounded capacitance of said lead-in conductor and forming a bypass across said resistance means, a portion of said resistance means together with said grounded capacitance forming a first RC member, and another portion of said resistance means together with said remaining capacitance means forming a second RC member having a shorter time constant than said first RC member.

3. A self-oscillating transistor mixer, comprising a transistor having a high-frequency input emitter circuit and having an oscillatory collector circuit, coupling means connected with said collector circuit for issuing an intermediate frequency output, emitter bias supply means comprising a capacitively grounded lead-in conductor at said transistor, two resistors series-connected with said lead-in conductor in said emitter circuit, one of said resistors together with said grounded capacitance forming a first RC member, a capacitor connected between ground and said emitter circuit and forming together with said other resistor a second RC member having a shorter time constant than said first RC member.

4. A self-oscillating transistor mixer, comprising a transistor having a grounded base and an emitter and a collector, high-frequency input coupling means connected to said emitter, grounded emitter bias supply means comprising at said transistor a capacitively grounded lead-in conductor, two resistors connected in series with each other between the non-grounded pole of said bias supply means and said input coupling means, one of said resistors forming a first RC member together with the ground capacitance of said lead-in conductor, a capacitor connected between ground and said other resistor and forming together with said other resistor a second RC member in series with said first RC member and having a shorter time constant than said first RC member, an oscillatory collector circuit extending between said collector and ground and tuned to the self-oscillation frequency of the mixer, and output coupling means connected with said collector circuit for issuing the generated intermediate frequency.

References Cited

UNITED STATES PATENTS

| | | | |
|---|---|---|---|
| 2,886,653 | 5/1959 | Lin | 325—451 XR |
| 2,957,979 | 10/1960 | Kammer | 325—451 XR |
| 3,140,444 | 7/1964 | Carlson | 325—451 XR |

KATHLEEN H. CLAFFY, Primary Examiner

R. S. BELL, Assistant Examiner

U.S. Cl. X.R.

325—451; 330—40